(12) United States Patent
Zhang et al.

(10) Patent No.: US 8,350,208 B1
(45) Date of Patent: Jan. 8, 2013

(54) TWO-TERMINAL MULTI-COLOR PHOTODETECTORS AND FOCAL PLANE ARRAYS

(75) Inventors: Yong-Hang Zhang, Scottsdale, AZ (US); Ding Ding, Chandler, AZ (US); Elizabeth Steenbergen, Gilbert, AZ (US)

(73) Assignee: Arizona Board of Regents, a body corporate of the State of Arizona, acting for and on behalf of Arizona State University, Scottsdale, AZ (US)

( * ) Notice: Subject to any disclaimer, the term of this patent is extended or adjusted under 35 U.S.C. 154(b) by 237 days.

(21) Appl. No.: 13/011,475

(22) Filed: Jan. 21, 2011

Related U.S. Application Data

(60) Provisional application No. 61/297,099, filed on Jan. 21, 2010.

(51) Int. Cl.
*H01J 31/00* (2006.01)
*H01J 40/14* (2006.01)

(52) U.S. Cl. ....... 250/214.1; 250/226; 257/21; 257/184; 257/440

(58) Field of Classification Search ............... 250/214.1, 250/208.1, 226; 257/21, 184, 440, 448, 459
See application file for complete search history.

(56) References Cited

U.S. PATENT DOCUMENTS

| | | | |
|---|---|---|---|
| 5,059,786 A | 10/1991 | Chu | |
| 5,113,076 A | 5/1992 | Schulte | |
| 5,149,956 A | 9/1992 | Norton | |
| 5,731,621 A | 3/1998 | Kosai | |
| 6,469,358 B1 | 10/2002 | Martin | |
| 6,818,917 B2 | 11/2004 | Kuan et al. | |
| 6,875,975 B2 | 4/2005 | Faska et al. | |
| 8,143,648 B1 * | 3/2012 | Moon | 257/194 |
| 2012/0068050 A1 * | 3/2012 | Mazzillo et al. | 250/208.1 |

OTHER PUBLICATIONS

Rolls, William H., "A Two-Colored Infrared Detector", Electro-optical Systems Design, vol. 9, Issue 11, pp. 10-13, 1977.
Campbell, J.C., et al, "Dual-wavelength demultiplexing InGaAsP photodiode", Appl. Phys. Lett. 34(6), pp. 401-402, Mar. 15, 1979.
Sun, M.J., et al, "Frequency demultiplexing in GaAs EAP waveguide detectors", Applied Optics, vol. 17, No. 22, pp. 3533-3534, Nov. 15, 1978.

(Continued)

*Primary Examiner* — Kevin Pyo
(74) *Attorney, Agent, or Firm* — McDonnell Boehnen Hulbert & Berghoff LLP

(57) ABSTRACT

Two-terminal multi junction photodetectors and focal plane arrays for multi-color detection or imaging acquisition can be formed by connecting photodiodes with different bandgaps or wavelengths, through tunnel diodes, in series with the same polarization. Under reverse bias in the dark, the total current going through such multi junction photodetectors is dictated by the smallest reverse saturation current of the photodiodes. When in operating mode, a set of light sources with different wavelengths corresponding to each individual photodiode can be used to optically bias all the photodiodes except the detecting photodiode Under illumination, all other photodiodes work in the photovoltaic mode and have much higher maximum possible reverse currents than the detecting photodiode. As a result, the total current of the multi junction photodetector is dictated by the detecting photodiode. Therefore, a total current can be read by, for example, read-out circuits to give the optical signal strength at that specific wavelength of the detecting photodiode. By using an algorithm one can use such multi junction photodetectors to detect different wavelengths and to take multicolor images.

34 Claims, 15 Drawing Sheets

OTHER PUBLICATIONS

Blazejewski, et al., "Bias-switchable dual-band HgCdTe infrared photodetector", J. Vac. Sci. Technol. B., 10(4), pp. 1626-1632, Jul./Aug. 1992.

Yoon, et al., "Radiative Coupling Effects in GaInP/GaAs/Ge Multijunction Solar Cells", 3rd World Conference on Photovoltaic Energy Conversion, Osaka, Japan, pp. 745-748, May 11-18, 2003.

Smith, et al., "HgCdTe Focal Plane Arrays for Dual-Color Mid- and Long-Wavelength Infrared Detection", J. Electronic Materials, vol. 33, No. 6, pp. 509-516, 2004.

Rogalski, A., "New material systems for third generation infrared photodetectors", Opto-Electronics Review, 16(4), pp. 458-482, 2008.

Lim, et al., "Analysis of Spectral Photocurrent Response from Multi-Junction Solar Cells Under Variable Voltage Bias", IEEE, pp. 712-716, 2010.

Chiu, et al., "Multi-Spectral QWIP-LED Devices: A Feasibility Study", Defense Research Establishment Ottawa Technical Memorandum, Oct. 1999.

Rogalski, A., "Optical detectors for focal plane arrays", Opto-Electronics Review, 12(2), pp. 221-245, 2004.

Zhang et al., Proceedings of the 33rd IEEE Photovoltaic Specialists Conference, pp. 30, 2008.

Meusel, M. Baur, G. Letay, A. W. Bett, W. Warta, E. Fernandez, Prog. Photovolt:Res. Appl. 11, 499 (2003).

Baur, C. Hermle, F. Dimroth, A. W. Bett, Appl. Phys. Lett. 90, 192109 (2007).

* cited by examiner

TWO-TERMINAL MULTI-COLOR PHOTODETECTORS AND FOCAL PLANE ARRAYS

CROSS-REFERENCE TO RELATED APPLICATIONS

This application claims the benefit of the filing date of U.S. Provisional Application Ser. No. 61/297,099, filed Jan. 21, 2010, which is hereby incorporated by reference in its entirety.

FIELD OF THE INVENTION

The disclosure generally provides two-terminal multijunction photodetectors (MJPD) and focal plane arrays (FPAs) for multi-color detection or imaging.

BACKGROUND OF THE INVENTION

The state of the art of focal two-color plane arrays (FPAs) are made of many two- or three-terminal two-color photodetector pixels integrated with electronic readout integrated circuits (ROIC). However, a multicolor (>2) photodetector pixel often times requires many more terminals, making it very difficult, even impossible for large arrays, to integrate a multicolor photodetector array with ROICs due to the dramatically increased number of contacts and the real estate of their traces on the chip. A clever approach was invented and has been utilized to enable a two-color FPA using only two terminals to connect to each MJPD pixel, which consists of two different wavelength photodiodes with opposite polarity connected in series, as shown in FIG. 1 (see, Eric F. Schulte, *Two terminal multi-band infrared radiation detector*, U.S. Pat. No. 5,113,076; and Rogalski et al., *Opto-Electronics Review* 2008, 16, 458-82; and Smith et al., "HgCdTe focal plane arrays for dual-color mid- and long-wavelength infrared detection," *J. of Elect. Mater.* 2004, 33, 509-516). The operation principle is to simply change the bias voltage to select which photodiode operates in the photoconductive mode. The two-terminal configuration enables flip-chip bonding of the FPA directly on the ROIC and has been widely used in commercially available dual-band IR FPAs. Unfortunately, this traditional approach becomes quite challenging, if not impossible, for three or more color (or band) FPAs.

SUMMARY OF THE INVENTION

In one aspect, photodetector modules are provided comprising, (i) one or an array of multi junction photodetectors (MJPDs), wherein each individual MJPD comprises (a) a first building block having a first bandgap; (b) an ultimate building block, having a second bandgap positioned over or under the first building block; and (c) a tunnel diode between each of the building blocks; wherein the tunnel diodes have reversed polarity with respect to the building blocks; wherein the building blocks are serially connected with the same polarization, and the first and second bandgaps are not identical; and wherein the first building block or ultimate building block comprises a detecting surface; (ii) a first light source having a first light spectrum that can be absorbed only by the first building block; and (iii) a second light source having a second light spectrum that can be absorbed only by the ultimate building block; wherein each light source is positioned to illuminate the detecting surface of the MJPDs.

In another aspect, methods are provided for collecting an optical signal comprising providing an photodetector module comprising one or an array of multi junction photodetectors (MJPDs), wherein each individual MJPD comprises (a) a first building block having a first bandgap; (b) an ultimate building block, having a second bandgap, positioned over or under the first building block; and (c) a tunnel diode between each of the building blocks; wherein the tunnel diodes have reversed polarity with respect to the building blocks; wherein the building blocks are serially connected with the same polarization, and the first and second bandgaps are not identical; and wherein the first building block or ultimate building block comprises a detecting surface; illuminating the detecting surface with one or more light sources to optically bias all except for one of the building blocks within each of the individual MJPDs; exposing the detecting surface to an optical signal to generate a photodetector response; and collecting the photodetector response.

DETAILED DESCRIPTION OF THE INVENTION

Figure 1:
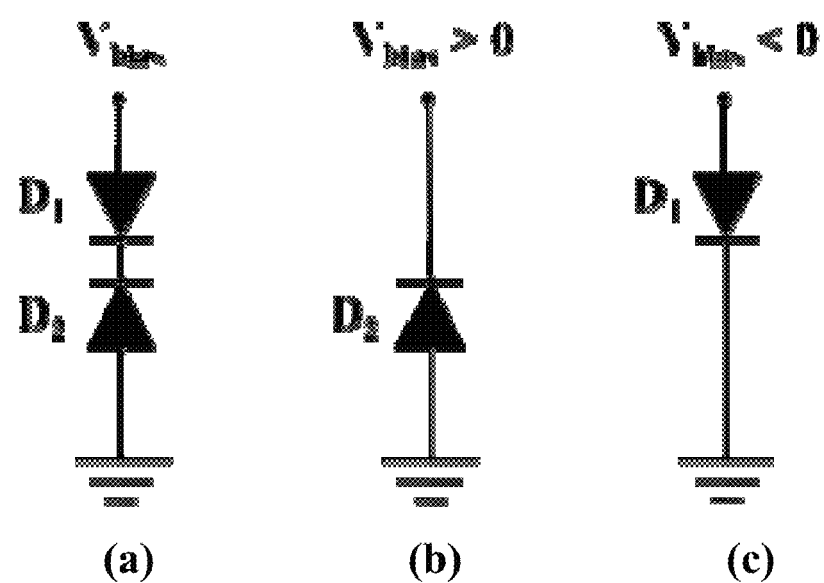
FIG. 1 shows (a) two different wavelength photodetectors, $D_1$ and $D_2$ for two different detection bands, with opposite polarity connected in series; (b) photodiode $D_2$ is reversely biased and operates in the photoconductive mode when the external bias voltage ($V_{bias}$) is positive; the voltage drop across the forward biased $D_1$ is negligible in this case; (c) photodiode $D_1$ is reversely biased and operates in the photoconductive mode when the external bias voltage is negative; the voltage drop across the forward biased $D_2$ is negligible in this case.
Figure 2A:
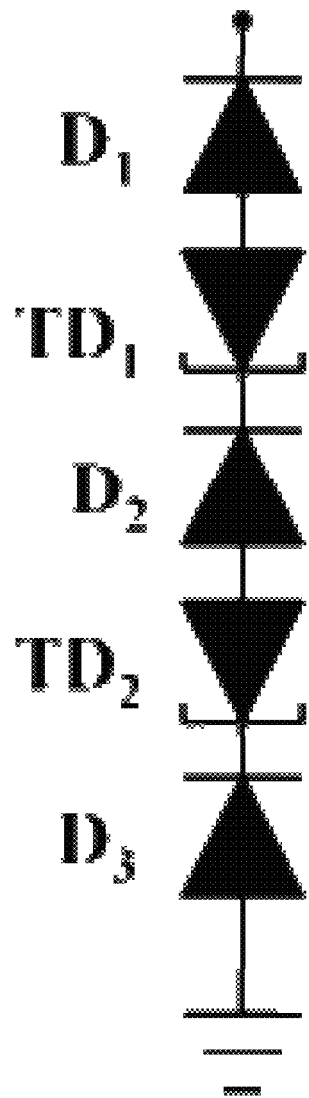
FIG. 2a shows the circuit symbol of a two-terminal multijunction photodetector (MJPD) comprised of three building blocks, e.g. three different photodiodes, $D_1$, $D_2$, and $D_3$, and two tunnel diodes, $TD_1$ and $TD_2$.
Figure 2B:
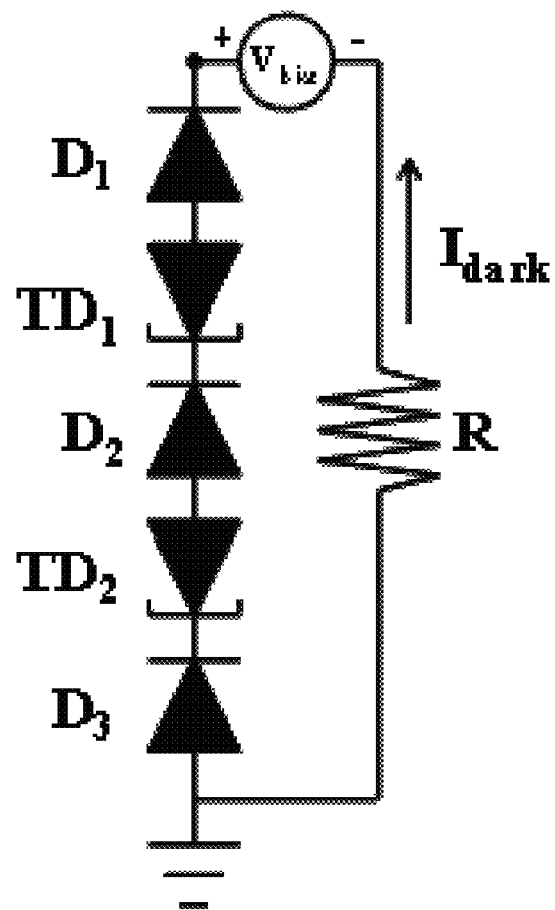
FIG. 2b is a circuit diagram of a multijunction photodetector (MJPD) connected with an external bias and a load resistor; the MJPD is in the dark without any optical bias applied to the photodiodes.

Herein, an approach is provided to enable two-terminal multijunction photodetectors (MJPDs) and FPAs for multi-color (>1) detection or imaging. As shown in FIG. 2a, each MJPD consists of multiple photodiodes ($D_1$-$D_3$) with different bandgaps, or cutoff wavelengths, connected in series with the same polarization and with a tunnel diode ($TD_1$ & $TD_2$) with a reverse polarity in between any two photodiodes. Without being limited to any one theory of operation, under external reverse bias ($V_{bias}$), the total dark current ($I_{dark}$) going through such a MJPD is dictated by the smallest reverse saturation current of all of the photodiodes, which typically will be that of the photodiode with the largest bandgap (see FIG. 2b).

Figure 2C:
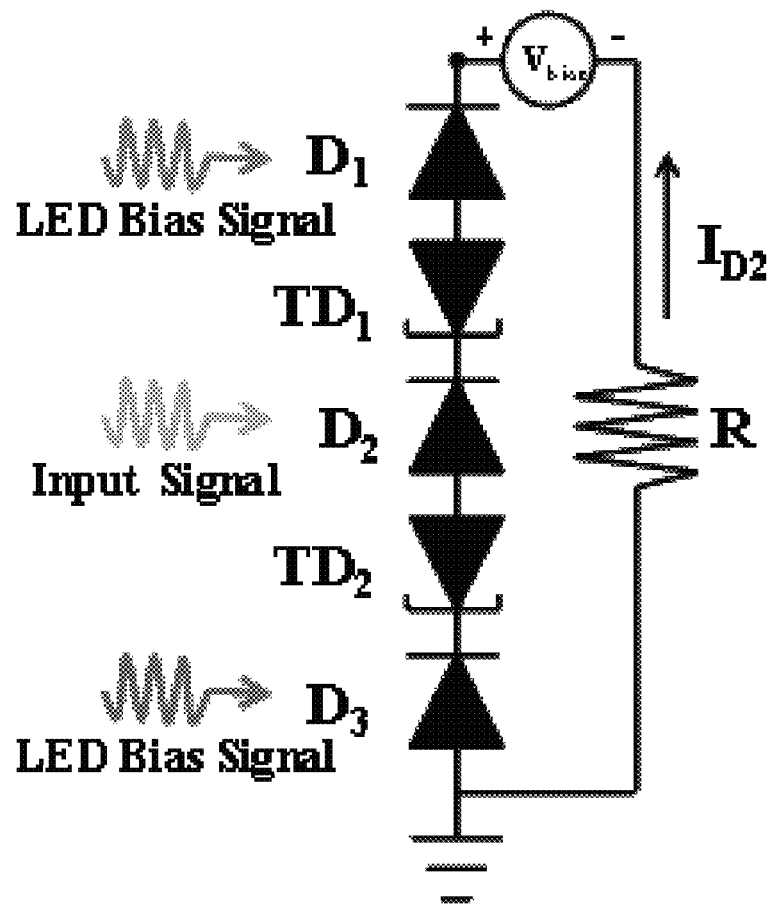
FIG. 2c shows a circuit diagram of an MJPD illuminated by optical biases and signal light; the total photogenerated current of the MJPD is dictated by the detecting photodiode's ($D_2$) current in the MJPD, as long as it is smaller than the smallest maximum reverse current of all the optically biased photodiodes ($D_1$ and $D_3$), which operate in the photovoltaic (PV) mode when $V_{Bias}=0$.

As shown in FIG. 2c, when a set of light sources (e.g., LEDs or laser diodes) with different wavelengths corresponding to each individual photodiode (building block) in a MJPD are used to optically bias all the photodiodes (for example, $D_1$ & $D_3$) except the detecting photodiode (for example, $D_2$), the entire MJPD operates as one single-color detector with a spectral response determined by the detecting photodiode in the MJPD. If the load resistor (R) is small enough and all other photodiodes are optically biased, the detecting photodiode will be under reverse bias even if the external bias $V_{bias}$=0, and it will operate in photoconductive mode to detect the light signal passing through the top photodiode or photodiodes, and above its own bandgap energy, $Eg_i$ (or below its cutoff wavelength, $\lambda_i$).

Figure 3:
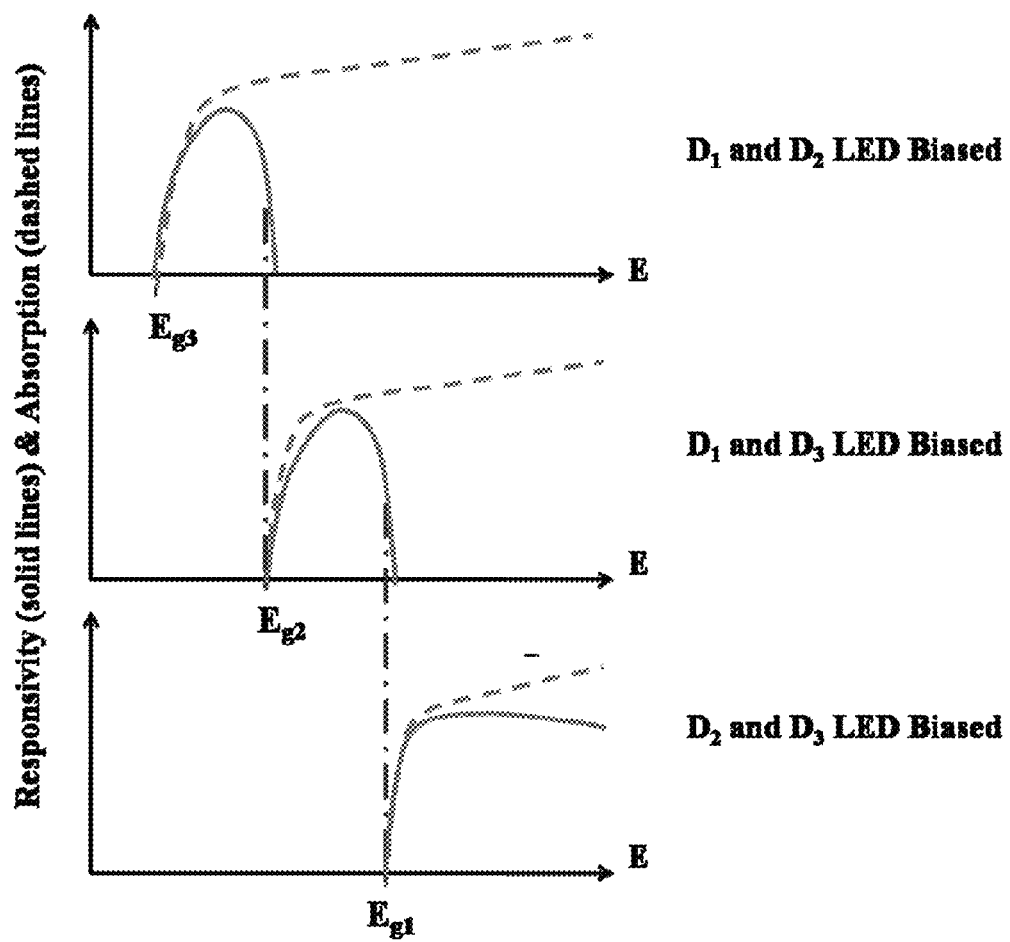
FIG. 3 is a schematic diagram of responsivities (solid lines) and absorption coefficients (dashed lines) of the three photodiodes in a typical triple junction photodetector under different optical biases.

FIG. 3 shows a schematic illustration of the detector responsivity under different LED biases. Under LED illumination, all the optically biased photodiodes work in the photovoltaic (PV) mode, and the total current is dictated by the detecting photodiode in the MJPD, as long as it is smaller than the smallest maximum reverse current of all the optically biased photodiodes.

Accordingly, in one embodiment are provided photodetector modules comprising, (i) one or an array of multi junction photodetectors (MJPDs), wherein each individual MJPD comprises (a) a first building block having a first bandgap; (b) an ultimate building block, having a second bandgap positioned over or under the first building block; and (c) a tunnel diode between each of the building blocks; wherein the tunnel diode s have reversed polarity with respect to the building blocks; and wherein the building blocks are serially connected with the same polarization, and the first and second bandgaps are not identical; and wherein the first building block or ultimate building block comprises a detecting surface; (ii) a first light source having a first light spectrum that can be absorbed only by the first building block; and (iii) a second light source having a second light spectrum that can be absorbed only by the ultimate building block; wherein each light source is positioned to illuminate the detecting surface of the MJPDs.

The array of multi junction photodetectors (MJPDs) can generally be arranged in a predetermined arrangement. In one embodiment, the array is a two-dimensional array. In another embodiment, the array is a linear array. When arranged in an array, each individual MJPD comprises two contacts; one of which is a discrete contact for each individual MJPD while the other is a common contact for the entire array.

In an embodiment of any of the preceding embodiments, each individual MJPD can further comprise a semiconducting substrate, wherein the first building block is positioned over, or directly over, the semiconducting substrate. The semiconducting substrate can be any such substrate suitable for the intended purpose. In one embodiment, the semiconducting substrate is an III-V semiconductor substrate or a virtual substrate consisting of an epitaxial III-V semiconductor layer grown on another substrate made of other semiconductors, such as a ZnTe or GaSb epitaxial layer on a Si or Ge substrate. Examples of III-V substrates include, but are not limited to, a substrate comprising, consisting essentially of, or consisting of GaAs, GaSb, InAs, InSb, or InP. Semiconducting substrates comprising an epitaxial III-V semiconductor layer on another substrate include, but are not limited to epitaxial GaAs, GaSb, InAs, InSb, or InP layers on a Si or Ge substrate, where the Si or Ge substrate can be intrinsic, or n- or p-doped.

In another embodiment, the semiconducting substrate is an II-VI semiconductor substrate or an epitaxial II-VI semiconductor layer grown on another substrate, such as a semiconducting substrate, or a Si or Ge substrate. Examples of II-VI substrates include, but are not limited to, a substrate comprising, consisting essentially of, or consisting of CdSe, CdTe, CdZnTe, or ZnTe. Semiconducting substrates comprising an epitaxial II-VI semiconductor layer on another substrate include, but are not limited to epitaxial CdSe, CdTe, CdZnTe, or ZnTe layers on a Si or Ge substrate, where the Si or Ge substrate can be intrinsic or n- or p-doped.

When formed over a semiconducting substrate, each building block can be lattice matched or pseudomorphically strained, or mismatched, to the semiconducting substrate. Alternatively, each building block can be lattice matched or pseudomorphically strained. or mismatched to one another.

In another embodiment of any of the preceding embodiments, an array of MJPDs, can be metal bump mounted to a readout integrated circuit (ROIC), wherein the first building block is in contact with the bumps. Such bump mounting can be according to any methods known in the art that are suitable for the purpose, for example, the mounting can be via indium bumps. The ROIC can be for example, one which does not require the change of bias polarity during operation.

Figure 4A:
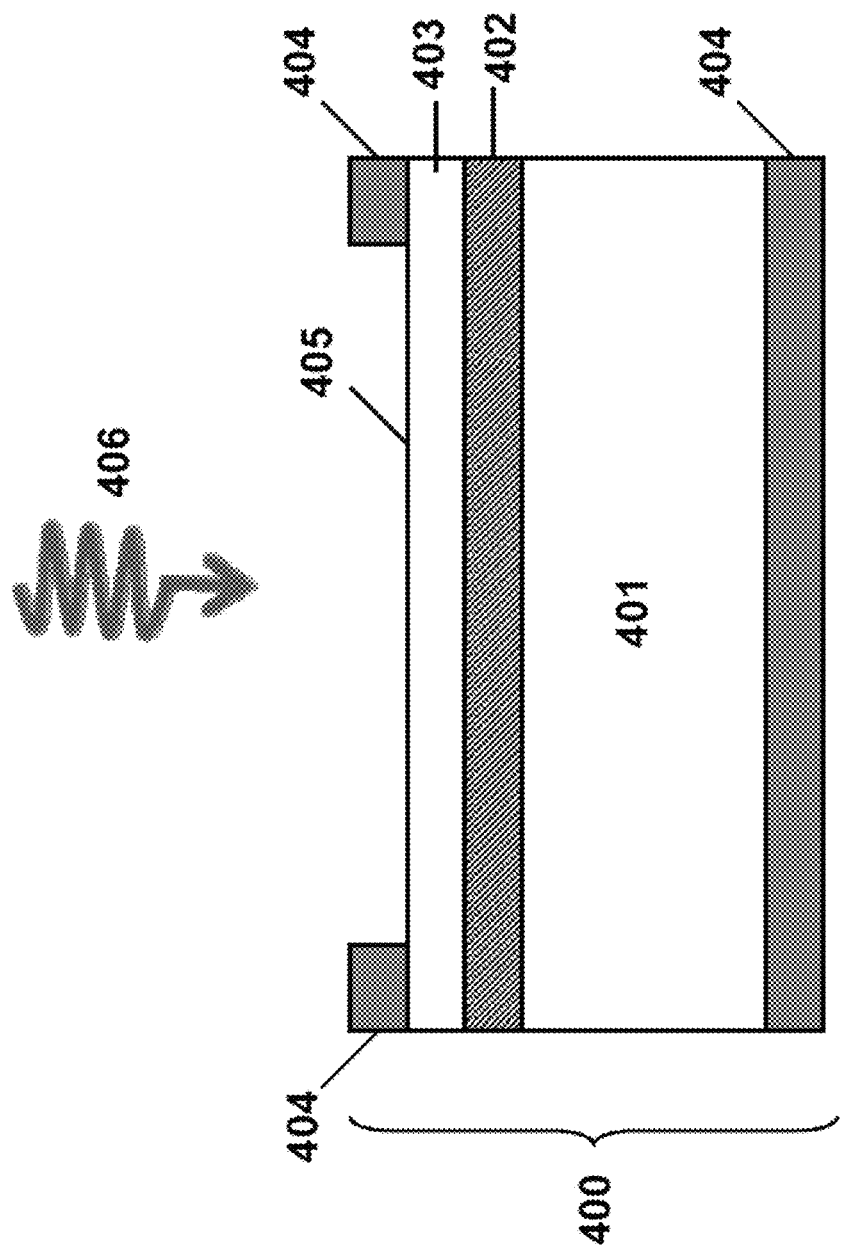
FIG. 4a is a cross-sectional drawing of an embodiment of a photodetector module as described herein.

As shown in FIG. 4a, in one embodiment, the MJPDs (400) can comprise a substrate (401) with a first building block (402) formed over the substrate and an ultimate building block (403) formed over the first building block (402), and contacts (404) for addressing the MJPD. In such an arrangement, a detecting surface (405) of the MJPDs can be exposed to an optical signal (406) for detection.

Figure 4B:
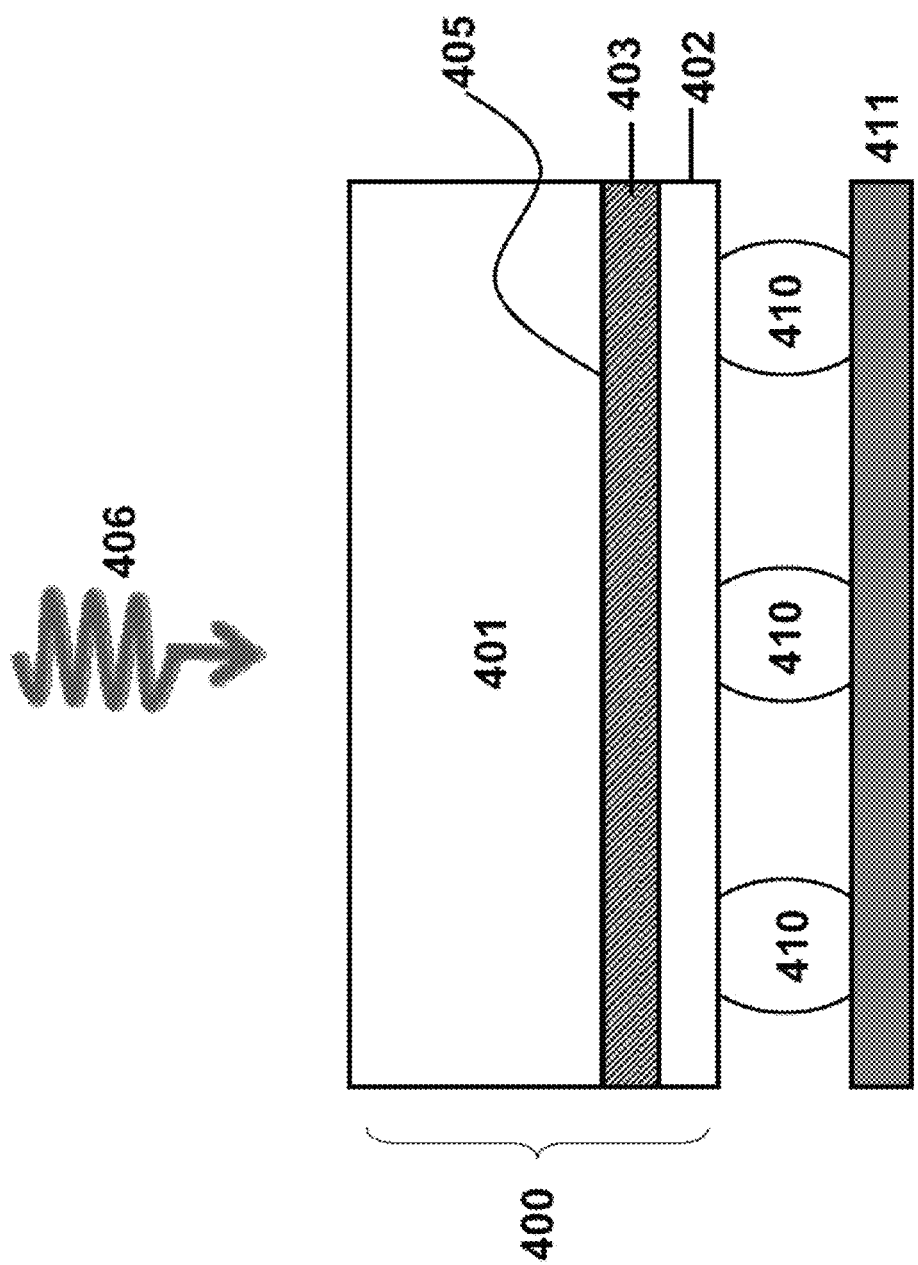
FIG. 4b is a cross-sectional drawing of an embodiment of a photodetector module as described herein where the MJPD or FPA is bump-mounted to an ROIC.

In another embodiment, as shown in FIG. 4b, the MJPD (400) can comprise a substrate (401) with an ultimate building block (403) formed over the substrate and a first building block (402) formed over the ultimate building block (403). The MJPD can be mounted to a ROIC (411) via metal bumps (410), such as In, in contact with the first building block (402). In such an arrangement, a detecting surface (405) of the MJPDs can be exposed to an optical signal (406) for detection.

Alternatively, in another embodiment, the MJPD can comprise a substrate with a first building block formed over the substrate and an ultimate building block formed over the first building block. The MJPD can be mounted to a ROIC via metal bumps, such as In, in contact with the ultimate building block. In such an arrangement, a detecting surface of the MJPDs can be exposed to an optical signal for detection.

Figure 4C:
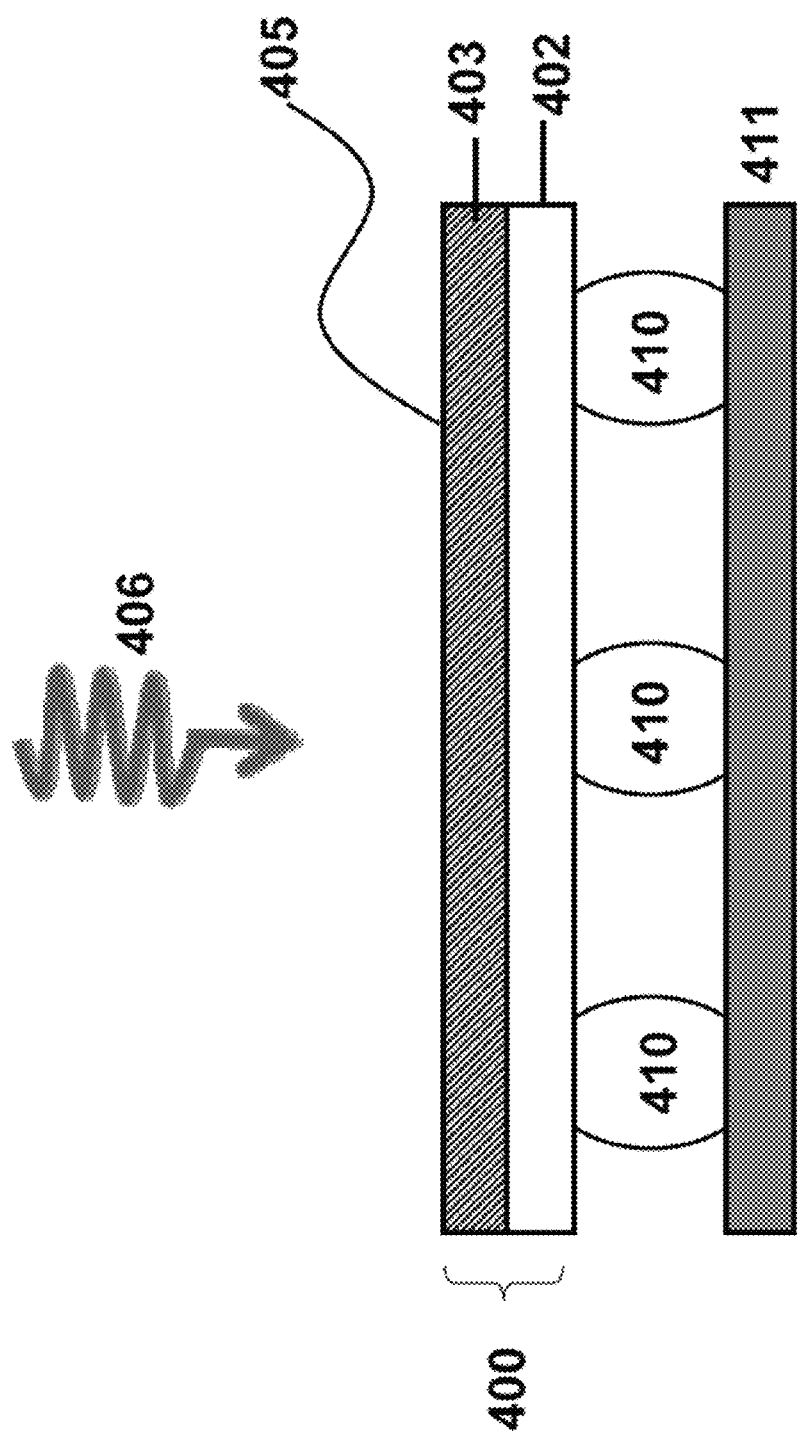
FIG. 4c is a cross-sectional drawing of an embodiment of a photodetector module as described herein where the MJPD or FPA is bump-mounted to an ROIC and the substrate has been removed.

In another embodiment, as shown in FIG. 4c, the MJPD (400) can comprise an ultimate building block (403) formed over a first building block (402), as shown in FIG. 4b, where the substrate has been removed according to methods familiar to one skilled in the art. The MJPD can be mounted to a ROIC (411) via metal bumps (410), such as In, in contact with the first building block (402). In such an arrangement, a detecting surface (405) of the MJPDs can be exposed to an optical signal (406) for detection.

Alternatively, in another embodiment, the MJPD can comprise a ultimate building block formed a first building block, where the substrate has been removed according to methods familiar to one skilled in the art. The MJPD can be mounted to a ROIC via metal bumps, such as In, in contact with the ultimate building block. In such an arrangement, a detecting surface of the MJPDs can be exposed to an optical signal for detection.

In principle, the number of building blocks is unlimited, enabling an unlimited number of colors to be detected. Each of the MJPDs can comprise one or a plurality of building block between the first and ultimate building blocks. In an embodiment of any of the preceding embodiments, each MJPD further comprises (i) a third building block having a third bandgap positioned between the first and ultimate building blocks, which are connected through a tunnel diode between any two of them, wherein the building blocks are serially connected with the same polarization, and the first, second, and third bandgaps are not identical, and the tunnel diodes are connected in reverse polarization; and (ii) a third light source having a third light spectrum that can be absorbed only by the third building block; wherein the third light source is positioned to illuminate the detecting surface of the MJPDs.

In an embodiment of any of the preceding embodiments, each MJPD further comprises (i) a fourth building block having a fourth bandgap positioned between the first and ultimate building block which are connected through a tunnel diode between any two of them, wherein the building blocks are serially connected with the same polarization, and the first, second, third, and fourth bandgaps are not identical, and the tunnel diodes are connected in reverse polarization; and (ii) a fourth light source having a fourth light spectrum that can be absorbed only by the fourth building block; wherein the fourth light source is positioned to illuminate the detecting surface of the MJPDs.

In an embodiment of any of the preceding embodiments, each MJPD further comprises (i) a fifth building block having a fifth bandgap positioned between the first and ultimate building blocks, which are connected through a tunnel diode between any two of them, wherein the building blocks are serially connected with the same polarization, and the first, second, third, fourth, and fifth bandgaps are not identical, and the tunnel diodes are connected in reverse polarization; and (ii) a fifth light source having a fifth light spectrum that can be absorbed only by the fifth building block; wherein the fifth light source is positioned to illuminate the detecting surface of the MJPDs.

In an embodiment of any of the preceding embodiments, each MJPD further comprises (i) a sixth building block having a sixth bandgap positioned between the first and ultimate building blocks, which are connected through a tunnel diode between any two of them, wherein the building blocks are serially connected with the same polarization, and the first, second, third, fourth, fifth, and sixth bandgaps are not identical, and the tunnel diodes are connected in reverse polarization; and (ii) a sixth light source having a sixth light spectrum that can be absorbed only by the sixth building block; wherein the sixth light source is positioned to illuminate the detecting surface of the MJPDs.

Each MJPD can further comprise a load resistor electrically connected between the first and the ultimate building blocks or the substrate, when present. When the MJPD is attached to a ROIC, the resistor can be part of the readout circuit itself.

Each of the light sources, in any of the preceding embodiments, can provide a light spectrum which can be absorbed by only one of the building blocks. For example, each light source can be a light emitting diode (LED), laser diode, or broadband light source with filters. The light sources are positioned such that the light they emit is in optical communication with the detecting surface of the MJPDs. For example, the light sources can be positioned on a separate surface from the MJPD. In another example, the light sources can be integrated on a chip with the MJPDs and the light can be guided to each individual MJPD using transparent waveguides, such as, but not limited to, ZnO. Each light source emits a light spectrum which can be absorbed by only one of the MJPD building blocks (i.e., the multi junction photodetector building blocks and light sources are color matched).

The materials used for the preceding building blocks can be any organic or inorganic semiconductors. If building blocks are made of lattice-matched II/VI (MgZnCdHg)(SeTe) and III/V InGaAsSb materials (see, Zhang et al., Proceedings of the 33rd IEEE Photovoltaic Specialists Conference, pp. 30, (2008)), and InAs/InAsSb or InAs/InGaSb type-II superlattices are adopted, the resulting building blocks can cover UV, visible, near IR, and far infrared wavelengths. In principle the number of the building blocks is unlimited if lattice-matched II-VI/III-V materials are used, enabling hyperspectral detection.

In one embodiment, each building block independently comprises III-V, II-VI, IV-IV, or IV-VI alloy layers or a mixture thereof. In another embodiment, each building block independently comprises III-V or II-VI alloy layers or a mixture thereof. In one embodiment, each building block independently comprises III-V or II-VI alloy layers. In one embodiment, each building block independently comprises III-V alloy layers. In one embodiment, each building block independently comprises II-VI alloy layers.

In another embodiment, each building block comprises a p-n junction having at least two alloy layers, wherein the alloy layers are independently III-V or II-VI alloy layers, wherein one alloy layer is p-doped and the other alloy layer is n-doped. In certain embodiments, at least one p-n junction comprises a II-VI alloy layer. In certain other embodiments, at least one p-n junction comprises an III-V alloy layer.

Each alloy layer can be doped with one or more dopants as is familiar to those skilled in the art. For example, Table 1 lists n- and p-doped materials which can be used according to the invention, their respective dopants, and maximum doping concentrations [n (cm$^{-3}$) or p (cm$^{-3}$)] of the dopant therein.

TABLE 1

| Materials | n- Dopants | n (cm$^{-3}$) | p- Dopants | p (cm$^{-3}$) |
|---|---|---|---|---|
| n-ZnSe | I | >10$^{18}$ | N | 4 × 10$^{17}$ |
| n-CdSe | Cl | >10$^{19}$ | N | 10$^{17}$ |
| n-CdTe | I | 7 × 10$^{18}$ | N | 2 × 10$^{17}$ |
| n-ZnTe | Al, Cl | <4 × 10$^{18}$ | P, N | 3 × 10$^{19}$ |
| n-MgSeTe | Cl | ~10$^{19}$ | N | 7 × 10$^{17}$ |
| n-AlGaAsSb | Te | 3 × 10$^{18}$ | Be, C | 1 × 10$^{19}$ |
| n-GaSb | Te | 7 × 10$^{18}$ | Be, C | 1 × 10$^{19}$ |

In certain other embodiments, each building block further comprises a third layer contacting the p-n junction. In one embodiment, the third layer comprises the same or different alloy as the p-n junction and is p$^+$, P, n$^+$, or N-doped. In certain embodiments, each building block comprises three layers of the form p$^+$pn, pnn$^+$, Ppn, or pnN. In one example, each building block comprises three layers of the form p$^+$pn.

In certain other embodiments, each building block further comprises a third and a fourth layer. In one embodiment, the third layer comprises the same or different alloy as the p-n junction and is P or p$^+$ doped; and the fourth layer comprises the same or different alloy as the p-n junction and is N or n$^+$ doped. In certain embodiments, each building block comprises four layers of the form PpnN, p$^+$pnN, p$^+$pnn$^+$, or Ppnn$^+$.

When at least one alloy layer is a III-V alloy layer, then each III-V alloy layer can independently comprise a binary, ternary, or quaternary (InGaAl)(AsSb) alloy. Suitable III-V alloys include, but are not limited to, GaSb, InAsSb, GaInSb, GaInAsSb, or AlGaAsSb.

When at least one alloy layer is a II-VI alloy layer, then each II-VI alloy layer can independently comprise a binary, ternary, or quaternary (MgZnCdHg)(SeTe) alloy. Suitable II-VI alloys include, but are not limited to, ZnTe, CdZnTe, CdSeTe, MgSeTe, ZnCdSeTe, HgCdTe, HgCdSe, or CdHgSeTe.

In an embodiment of any of the preceding, each of the II-VI and/or III-V alloy layers is lattice-matched or pseudomorphically strained to one another. In one embodiment, each of the II-VI and/or III-V alloy layers is lattice-matched to one another. In one embodiment, each of the II-VI and/or III-V alloy layers is pseudomorphically strained to one another.

In general, the bandgaps of each of the building block can be chosen to collect light over a spectrum ranging from infrared wavelengths through the entire visible spectrum. For example, in one embodiment, the bandgap of each of the building blocks is between about 0.012 eV and about 6.2 eV.

In certain of the preceding embodiments, each of the building blocks has a bandgap greater than the layer it is formed over. In other certain of the preceding embodiments, each of building blocks has a bandgap less than the layer it is formed over.

In general, each of the building blocks comprises at least one alloy layer which is predominantly responsible for absorption of light by that particular building block. The thickness of each alloy layer which is predominantly responsible for absorption of light can be optically-thick to provide a sharp absorption edge for each detector. Such alloy layers can have a thickness between, for example, about 0.01 μm and about 15 μm for direct bandgap or superlattice materials and about 10 μm and about 150 μm or thicker.

Figure 5:
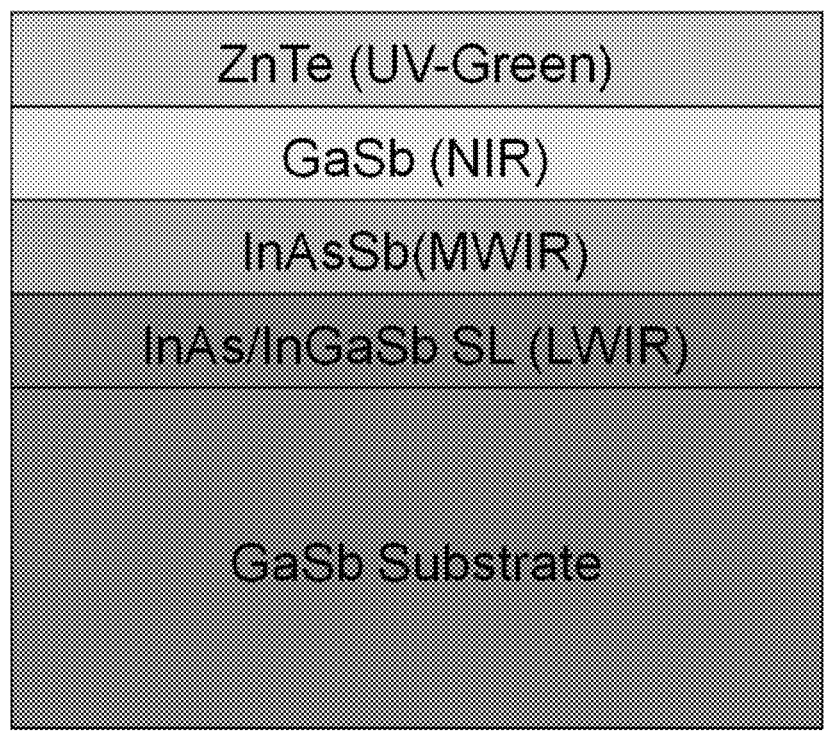
FIG. 5 is schematic layer structure of a four-color MJPD where II-VI and III-V semiconductors are used as an example (tunnel diodes between every two adjacent photodiodes not shown for clarity).

In one particular embodiment, the layer structure for an example of a four-color MJPD is schematically shown in FIG. 5, comprising ZnTe (from UV to green), GaSb (near IR, green to 1.6 μm), InAsSb (short- to mid-wavelength IR, 1.6 μm to 4 μm), and InAs/InAsSb or InAs/InGaSb type-II superlattice (mid- to long-wavelength IR, 4 μm to 12 μm) building blocks formed over a GaSb substrate.

In one embodiment, the bandgaps of a six-color design covering UV to long-wavelength IR can be as follows: $E_g$ Block 1≈3.10 eV (UV); $E_g$ Block 2≈1.77 eV (visible); $E_g$ Block 3≈0.8 eV (near IR); $E_g$ Block 4≈0.4 eV (short-wavelength IR); $E_g$ Block 5≈0.2 eV (mid-wavelength IR); and $E_g$ Block 6≈0.1 eV (long-wavelength IR). The particular bandgaps may vary according to different applications and purposes.

Since the biasing light sources (e.g., LEDs) can be mounted very close to the MJPDs, their light intensities can be orders of magnitude greater than the signal light intensity. As a result, the total current of the MJPD is dictated by the detecting photodiode. Therefore, the total current read by a ROIC only gives the optical signal strength of that specific band of the detecting photodiode.

With some simple algorithms, one can easily use such a MJPD to detect different wavelengths, or bands, and to acquire multicolor images, which enables the monolithically integrated hyperspectral FPA.

Figure 6:
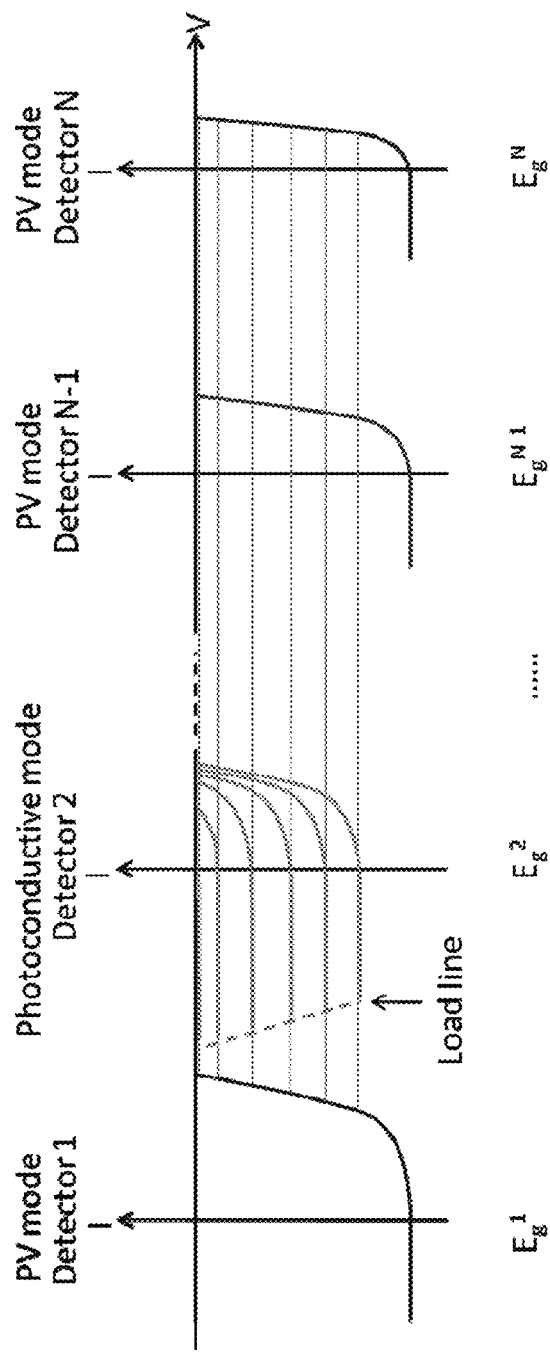
FIG. 6 is a schematic diagram of the operation modes for a discrete MJPD. The optically biased photodetectors are operating in photovoltaic mode, while the detecting photodiode operates in photoconductive mode; the total current is therefore dictated by the current from the detecting photodiode, which is proportional to the light intensity at the detecting wavelength or band.

A schematic diagram of the operation modes for a four junction photodetector is shown in FIG. 6. In this example, the second photodiode is the detecting device, and the other photodiodes are optically biased into photovoltaic mode. The total current is therefore dictated by the current from the detecting photodiode, which is proportional to the light intensity at the detecting wavelength or band. The load line of the whole MJPD is also shown in the figure, which gives the working points of the detecting photodiode under different signal light illumination.

In another aspect, the present disclosure provides methods for collecting an optical signal comprising providing an photodetector module comprising one or an array of multi junction photodetectors (MJPDs), wherein each individual MJPD comprises (a) a first building block having a first bandgap; (b) an ultimate building block, having a second bandgap, positioned over or under the first building block; and (c) a tunnel diode between each of the building blocks; wherein the tunnel diodes have reversed polarity with respect to the building blocks; wherein the building blocks are serially connected with the same polarization, and the first and second bandgaps are not identical; and wherein the first building block or ultimate building block comprises a detecting surface; illuminating the detecting surface with one or more light sources to optically bias all except for one of the building blocks within each of the individual MJPDs; exposing the detecting surface to an optical signal to generate a photodetector response; and collecting the photodetector response.

Assuming that we have N building blocks with N light sources (e.g., LEDs) for optical biasing, the total current of the entire photodetector is determined by the ith building block. During detection, light source i (LED$_i$) is turned off while all the other light sources (LEDs) are on. That is, the detecting surface is illuminated with one light source for each building block that is optically biased. The illumination can be simultaneously illuminating the detecting surface with one or more light sources to optically bias all except one of the building blocks within each of the individual MJPDs.

In one embodiment, the methods further comprises controlling the one or more light sources to change which one of the building blocks is not optically biased. The light sources can be switched on and off in a predetermined pattern such that the one building block which is not optically biased is serially rotated among the available building blocks.

A photodetector response is measured for each of the building blocks while it is not being biased. In certain embodiments, the optical signal can be modulated during measurement according to methods known in the art.

Then, an algorithm can be used to determine the intensity of the light absorbed by each building block.

In certain embodiments, the measured photodetector response is an electrical current. In certain other embodiments, the measured photodetector response is a voltage.

Crosstalk between different color photodiodes may be a potential issue. There are two possible scenarios which can cause crosstalk between different photodiodes in the multicolor configuration: (1) strong bias light from a top building block can penetrate it and be absorbed by the one underneath it; (2) the bias light for a bottom building block can be also absorbed by the tail states of the top building blocks.

Crosstalk can be addressed, for example, by (1) adding an optical modulator, such as a chopper, and using a lock-in technique to modulate the signal light; then, the AC signal can be easily distinguished from the DC biases; or (2) adding a shutter. From time to time, the shutter can be closed to calibrate all the pixels to electronically eliminate any possible crosstalk caused by the bias lights. Since LEDs are very stable light sources, such a calibration would only need to be carried out in large time intervals.

DEFINITIONS

Herein, a notation is used to refer to alloys having the form of two sets of elements each within its own set of parenthesis; for example, (ABCD)(EFGH). This notation means that the alloy comprised at least one element selected from A, B, C, and D, and at least one element selected from E, F, G, and H. When this notation is used in combination with the modifiers such as "binary", "ternary", "quaternary", "quinary", or "senary", among others, it means that the alloy contains a total of 2, 3, 4, 5, or even 6 elements, respectively, provided that at least one element selected from A, B, C, and D, and at least one element selected from E, F, G, and H. For example, a ternary (InGaAl)(AsSb) alloy includes both InAsSb and GaAlSb, among other combinations.

The term "about" as used herein means+/−10% of the referenced value.

The term "II-VI alloy" as used herein means an alloy where the constituent elements are selected from Groups IIA, IIB, and VIA, of the periodic table, wherein at least one constituent element is selected from Groups IIA and/or IIB of the periodic table and at least one constituent element is selected from Group VIA of the periodic table. Examples of II-VI alloys include, but are not limited to (a) binary alloys such as, but not limited to, Cadmium selenide (CdSe), Cadmium sulfide (CdS), Cadmium telluride (CdTe), Zinc oxide (ZnO), Zinc selenide (ZnSe), Zinc sulfide (ZnS), and Zinc telluride (ZnTe); (b) ternary alloy such as, but not limited to, Cadmium zinc telluride (CdZnTe, CZT), Mercury cadmium telluride (HgCdTe), Mercury zinc telluride (HgZnTe), and Mercury zinc selenide (HgZnSe); and (c) quaternary alloys such as, but not limited to, Cadmium mercury selenide telluride (CdHgSeTe) and Cadmium zinc selenide telluride (CdZnSeTe).

The term "III-V alloy" as used herein means an alloy where the constituent elements are selected from Groups IIIA and VA of the periodic table, wherein at least one constituent element is selected from Group IIIA of the periodic table and at least one constituent element is selected from Group VA of the periodic table. Examples of III-V alloys include, but are not limited to (a) binary alloys such as, but not limited to, Aluminum antimonide (AlSb), Aluminum arsenide (AlAs), Aluminum nitride (AlN), Aluminum phosphide (AlP), Boron nitride (BN), Boron phosphide (BP), Boron arsenide (BAs), Gallium antimonide (GaSb), Gallium arsenide (GaAs), Gallium nitride (GaN), Gallium phosphide (GaP), Indium antimonide (InSb), Indium arsenide (InAs), Indium nitride (InN), and Indium phosphide (InP); (b) ternary alloys, but not limited to, Aluminum gallium arsenide (AlGaAs, $Al_xGa_{1-x}As$), Indium gallium arsenide (InGaAs, $In_xGa_{1-x}As$), Aluminum indium arsenide (AlInAs), Aluminum indium antimonide (AlInSb), Gallium arsenide nitride (GaAsN), Gallium arsenide phosphide (GaAsP), Aluminum gallium nitride (AlGaN), Aluminum gallium phosphide (AlGaP), Indium gallium nitride (InGaN), Indium arsenide antimonide (InAsSb), and Indium gallium antimonide (InGaSb); (c) quaternary alloys such as, but not limited to, Aluminum gallium indium phosphide (AlGaInP, also InAlGaP, InGaAlP, AlInGaP), Aluminum gallium arsenide phosphide (AlGaAsP), Indium gallium arsenide phosphide (InGaAsP), Aluminum indium arsenide phosphide (AlInAsP), Aluminum gallium arsenide nitride (AlGaAsN), Indium gallium arsenide nitride (InGaAsN), and Indium aluminum arsenide nitride (InAlAsN); and (d) quinary alloys such as, but not limited to, Gallium indium nitride arsenide antimonide (GaInNAsSb). Higher order alloys include, for example, the senary alloy Indium gallium aluminum arsenide antimonide phosphide InGaAlAsSbP.

The term "IV-IV alloy" as used herein means an alloy where the constituent elements are selected from Group IV of the periodic table.

The term "IV-VI alloy" as used herein means an alloy where the constituent elements are selected from Group IV, of the periodic table, and at least one constituent element is selected from Group VIA of the periodic table.

The term "bandgap" or "$E_g$," as used herein means the energy difference between the highest occupied state of the valence band and the lowest unoccupied state of the conduction band of the material. The bandgap for a building block, as used herein, refers to the bandgap of the material that forms the p-n junction.

The term "lattice matched" as used herein means that the two referenced materials have the same or lattice constants differing by up to +/−0.2%. For example, GaAs and AlAs are lattice matched, having lattice constants differing by ~0.12%.

The term "pseudomorphically strained" as used herein means that layers made of different materials with a lattice parameter difference up to +/−2% can be grown on top of other lattice matched or strained layers without generating misfit dislocations. In certain embodiments, the lattice parameters differ by up to +/−1%. In other certain embodiments, the lattice parameters differ by up to +/−0.5%. In further certain embodiments, the lattice parameters differ by up to +/−0.2%.

The term "mismatched" as used herein, means that that the two referenced materials have a lattice parameter difference greater than +/−2%.

The term "building block" as used herein, means a region comprising a p-n junction having at least two layers of similar or dissimilar materials doped n and p type, respectively, where the absorption edge of this p-n junction defines the bandgap of the building block, as defined herein. However, such building blocks can comprise multiple layers. For example, a building block can comprise a p-n junction and a third doped layer to form a Ppn+ structure, wherein the P region can comprise material that has the same or larger bandgap than that of the p-n region, or a building block can comprise a p-n junction and one additional doped layer on each side of the p-n junction to form a PpnN structure, wherein the P and the N regions can comprise materials that have the same or larger bandgap than that of the p-n junction region.

The term "layer" as used herein, means a continuous region of a material (e.g., an alloy) that can be uniformly or non-uniformly doped and that can have a uniform or a non-uniform composition across the region.

The term "tunnel diode" as used herein, means a region comprising two heavily doped layers with n- and p-type, respectively. Both of these layers can be of the same materials (homojunction) or different materials (heterojunction).

The term "p-doped" as used herein means atoms have been added to the material (e.g., an alloy) to increase the number of free positive charge carriers.

The term "n-doped" as used herein means atoms have been added to the material (e.g., an alloy) to increase the number of free negative charge carriers.

The term "p+-doped" as used herein means atoms have been added to the material (e.g., an alloy) to increase the number of free positive charge carriers such that the material is degenerate, as is known to those skilled in the art.

The term "n+-doped" as used herein means atoms have been added to the material (e.g., alloy) to increase the number of free negative charge carriers such that the material is degenerate, as is known to those skilled in the art.

The term "P-doped" as used herein means the material is p-doped, as defined herein, and the bandgap of the material is the same or greater than the p-doped material of a p-n junction.

The term "N-doped" as used herein means the material is n-doped, as defined herein, and the bandgap of the material is the same or greater than the n-doped material of a p-n junction.

EXAMPLES

Example 1

Two-Terminal Multi-Color Photodetector

Figure 7:
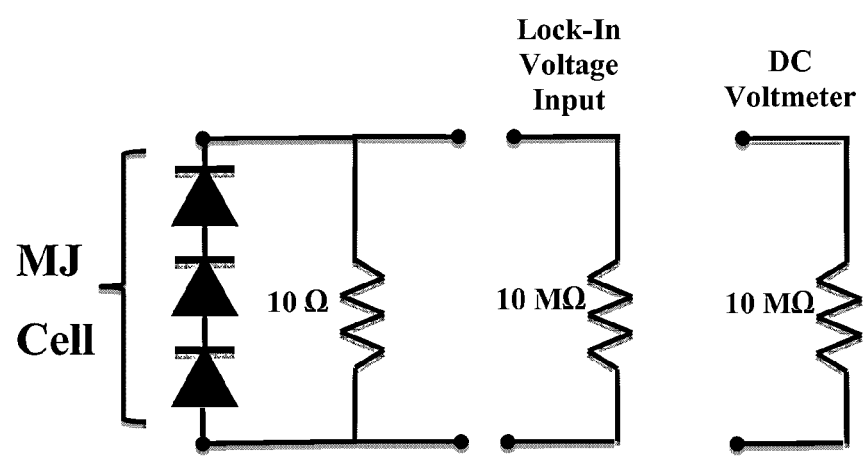
FIG. 7 is a circuit diagram for the experiment described in Example 1.

A 5.6 mm×5.6 mm InGaP/InGaAs/Ge triple junction solar cell from Millennium Communications Co. was biased with three lasers: 488 nm, 800 nm, and 1064 nm, and the laser input power to the "detector" was varied. A circuit diagram for the testing arrangement is shown in FIG. 7. The light signal input was chopped to clearly show the output voltage as measured by a Lock-in amplifier was due to the signal.

a. 488 nm Signal Input

With the 800 nm and 1064 nm photodiodes biased, the output should be based on the signal.

With the 488 nm and 800 nm photodiodes biased and the 1064 nm photodiode unbiased, the output should be zero.

With the 488 nm and 1064 nm photodiodes biased and the 800 nm photodiode unbiased, the output should be zero.

TABLE 2

| Signal 488 nm [Photons/cm$^2$/s] | Bias 800 nm [Photons/cm$^2$/s] | Bias 1064 nm [Photons/cm$^2$/s] | Output [mA] |
|---|---|---|---|
| $1.2 \times 10^{16}$ | $2.2 \times 10^{18}$ | $1.9 \times 10^{19}$ | 0.77 |
| $7.8 \times 10^{17}$ | $2.1 \times 10^{18}$ | $1.9 \times 10^{19}$ | 1.5 | b. 800 nm Signal Input

With the 488 nm and 1064 nm photodiodes biased, the output should be based on the 800 nm signal.

With the 488 nm and 800 nm photodiodes biased and the 1064 nm photodiode unbiased, the output should be zero.

With the 800 nm and 1064 nm photodiodes biased and the 488 nm photodiode unbiased, the output should be zero.

TABLE 3

| Signal 800 nm [Photons/cm$^2$/s] | Bias 488 nm [Photons/cm$^2$/s] | Bias 1064 nm [Photons/cm$^2$/s] | Output [mA] |
|---|---|---|---|
| $2.5 \times 10^{17}$ | $5.2 \times 10^{18}$ | $5.5 \times 10^{18}$ | 2.7 |
| $4.6 \times 10^{17}$ | $5.2 \times 10^{18}$ | $5.5 \times 10^{18}$ | 4.3 |
| $5.1 \times 10^{17}$ | $5.2 \times 10^{18}$ | $5.5 \times 10^{18}$ | 4.9 |
| $1.1 \times 10^{18}$ | $4.8 \times 10^{18}$ | $4.4 \times 10^{18}$ | 7.6 | c. 1064 nm Signal Input

With the 488 nm and 800 nm photodiodes biased, the output should be based on the 1064 nm signal. Table 4 shows the output does not follow the input once the unbiased detector no longer limits the current.

TABLE 4

| Signal 1064 nm [Photons/cm$^2$/s] | Bias 488 nm [Photons/cm$^2$/s] | Bias 800 nm [Photons/cm$^2$/s] | Output [mA] |
|---|---|---|---|
| $1. \times 10^{18}$ | $1.1 \times 10^{19}$ | $1.8 \times 10^{18}$ | 2.1 |
| $3.4 \times 10^{18}$ | $1.1 \times 10^{19}$ | $1.8 \times 10^{18}$ | 3.9 |
| $5.1 \times 10^{18}$ | $1.1 \times 10^{19}$ | $1.8 \times 10^{18}$ | 7.3 |
| $8.5 \times 10^{18}$ | $1.1 \times 10^{19}$ | $1.8 \times 10^{18}$ | 12.5 |
| $1.5 \times 10^{19}$ | $1.1 \times 10^{19}$ | $1.8 \times 10^{18}$ | 12.6 |

Assumed (1) All beams the same size and shape, however, the 800 nm beam was larger than the 488 nm and 1064 nm beams; (2) Beams entirely within the solar cell area (but some of the beam was on the edge of the cell where contacts reflect); (3) Beam power measured was 90% of power at the cell; (4) Beam power constant during measurement.

To get zero output when expected, the photodiodes must be properly biased with correctly balanced input powers. The output signal is relatively independent of bias strength as long as the detector cell remains current limiting. Table 5 shows cases where the output is zero.

TABLE 5

| Signal [Photons/cm$^2$/s] | Bias 488 nm [Photons/cm$^2$/s] | Bias 800 nm [Photons/cm$^2$/s] | Bias 1064 nm [Photons/cm$^2$/s] | Output [mA] |
|---|---|---|---|---|
| 488 nm - $3.4 \times 10^{17}$ | 0 | $4.3 \times 10^{17}$ | 0 | 0.001 |
| 488 nm - $3.4 \times 10^{17}$ | $2.7 \times 10^{17}$ | $1.6 \times 10^{17}$ | 0 | 0.009 |
| 800 nm - $2.0 \times 10^{17}$ | 0 | $3.6 \times 10^{16}$ | $5.4 \times 10^{17}$ | 0 |
| 800 nm - $4.0 \times 10^{16}$ | $1.6 \times 10^{17}$ | $2.4 \times 10^{17}$ | 0 | 0 |
| 1064 nm - $1.7 \times 10^{19}$ | $1.2 \times 10^{19}$ | 0 | $2.2 \times 10^{18}$ | 0 |
| 1064 nm - $1.7 \times 10^{18}$ | 0 | $1.3 \times 10^{18}$ | 0 | 0 |

Example 2

Two-Terminal Multi-Color Photodetector

Multi-color photodetectors and focal plane arrays (FPAs) are desirable for a variety of applications, including defense, imaging, environmental monitoring, communications, and spectroscopy.[1-3] Three-terminal monolithic, dual-band photodiodes[2] and two-terminal, voltage-bias-switchable, back-to-back dual-band photodiodes[4,5] are examples of existing two-color photodetectors. For FPAs to have more than two colors, additional terminals must be added for each pixel,[6-8] which greatly complicates the FPA layout and device processing, decreases the fill factor, and increases the readout integrated circuit (ROIC) complexity.[6]

This example proposes a novel optically-addressed two-terminal multi-color photodetector that maximizes the fill factor and simplifies the ROIC design. This photodetector makes FPAs with greater than two bands and only two terminals per pixel possible through the use of appropriate optical biasing to realize individual color detection.

Figure 8:
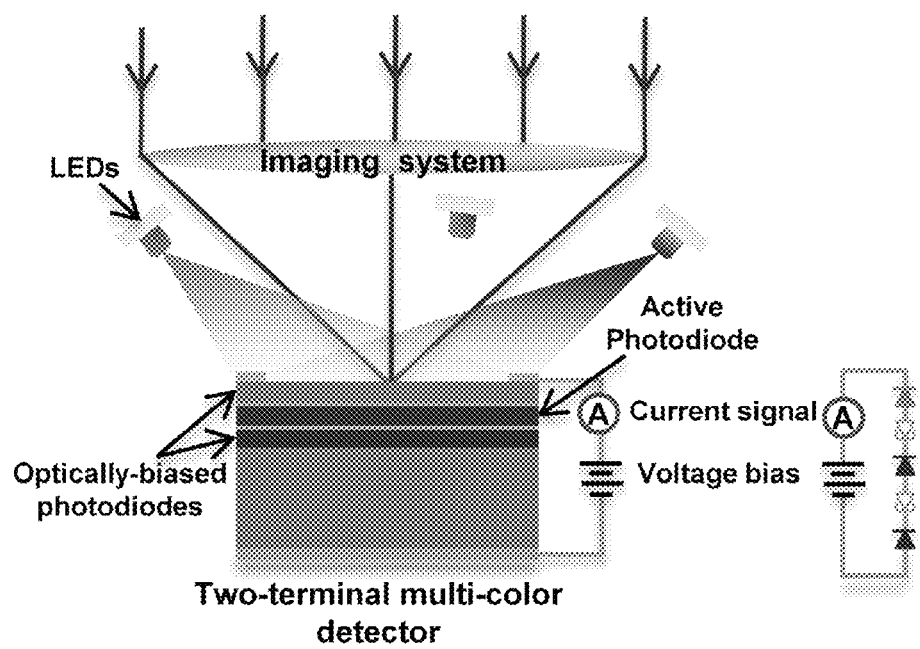
FIG. 8 is a schematic diagram of the optically-addressed, two-terminal, multi-color photodetector; the detector structure consists of multiple photodiodes with different cutoff wavelengths connected in series with tunnel diodes between adjacent photodiodes; the LEDs optically bias the non-active photodiodes in the detector to enable single color detection.

The photodetector structure and system operating principles are as follows. The proposed two-terminal photodetector, as shown in FIG. 8, consists of multiple photodiodes with different cutoff wavelengths monolithically connected in series with tunnel diodes between adjacent photodiodes. Due to the series connection, the photodiode with the smallest current dictates the output of the device. To optically address one of the photodiodes, all of the photodiodes except one, the active detector, are optically biased using a set of LEDs or laser diodes with output wavelengths within the spectral response range of the individual photodiodes. The photodiode's spectral response range spans the energies from the photodiode's band gap to the next highest band gap. The optically biased photodiodes operate in the photovoltaic mode with their forward voltages determined by the operating current of the entire device.[9] The optical bias creates a reverse voltage bias on the active photodiode, causing it to operate in the photoconductive mode. The device then has a very small current (the dark current of the active photodiode) when the input signal is not within the active photodiode's spectral response range, and thus the device is a single color detector with the spectral response of the active photodiode only. Such single color detection is maintained as long as the photogenerated current due to the signal is smaller than the photogenerated currents from the optically biased photodiodes. A multiplexing control algorithm can determine which combination of biasing LEDs are on to cycle through the available bands, thus enabling multi-color detection. The integration of multi-junction photodetectors and the optical biasing scheme allows the number of detecting bands to increase without raising the number of contacts above two per pixel.

To demonstrate this novel device concept, a commercial InGaP/InGaAs/Ge triple-junction solar cell (2 cm×2 cm) is used as the multicolor photodetector because the solar cell structure is almost identical to the proposed multi-color photodetector design. Three LEDs with center wavelengths (470 nm, 780 nm, 940 nm) within the response ranges of the photodiodes are used as the optical biasing sources. The "dark" current density vs. voltage (J-V) curves (FIG. 9) of the three photodiodes are measured with matching light bias photon flux ($1.0 \times 10^{16}$ photons/cm$^2$/s) on the non-active photodiodes and no light bias or signal on the active photodiode. The voltage is across the entire device, not just the active photodiode. The spectral responsivity (FIG. 10) of the active photodiode is also measured with equal optical bias photon flux illuminating the non-active photodiodes. In addition, a 2.1 V bias across the entire device is used for the Ge photodiode responsivity to reduce measurement artifacts.[9,10] The spectral response is measured using a Newport QE/IPCE system, with the spectral range limited by the monochromator gratings. The linear dynamic range measurements (FIG. 11) use modulated laser diodes with wavelengths of 405 nm, 780 nm, and 980 nm as signal sources, while the non-active photodiodes are under equal optical bias flux. Neutral density filters are used to achieve signal intensities over five orders of magnitude, and the resulting current is measured with a lock-in amplifier.

Figure 9:
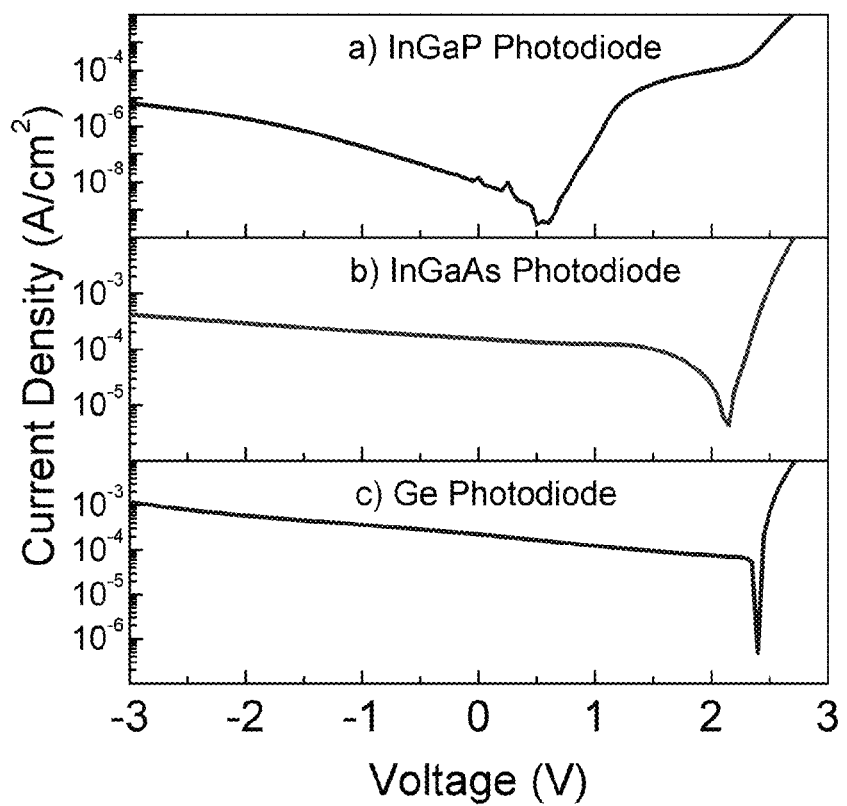
FIG. 9 shows dark current densities vs. voltage; the J-Vs were measured with matching optical bias photon flux on the non-active photodiodes and no input signal to the active photodiode; the voltage is across the entire device, not just the active photodiode.

The "dark" current densities vs. voltage (J-V) curves are shown in FIG. 9. The forward and reverse bias regions of the individual active photodiodes' J-Vs are clearly discernable. The magnitude of the dark current increases as the photodiode's band gap decreases, as expected. The operating point of the active photodiode on the reverse bias portion of its J-V curve depends on the voltage and light bias conditions, which can be selected to minimize the dark current.

Figure 10:
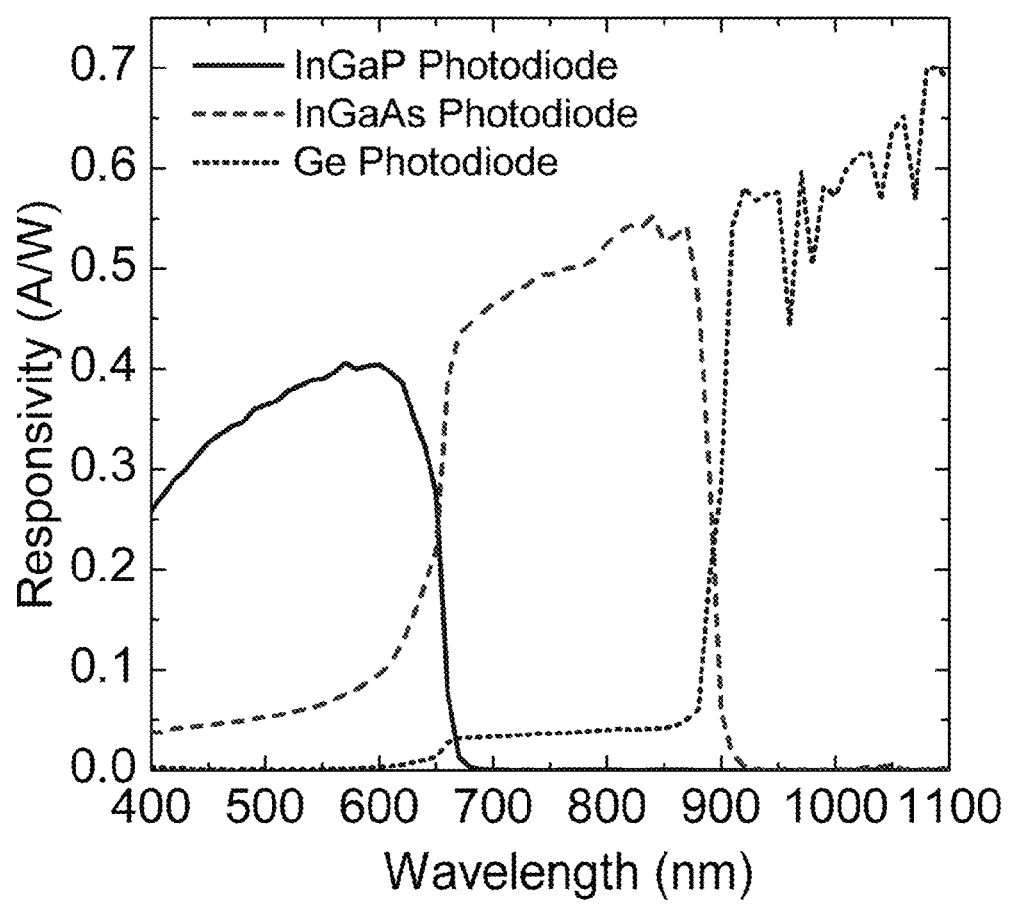
FIG. 10 is the spectral responsivity curve of each photodiode of Example 2; the responsivity was measured with matching photon flux on the non-active photodiodes.

The responsivity, as shown in FIG. 10 of the three photodiodes clearly confirms that optical biasing can address one photodiode at a time in a multi-color detector with only two-terminals. When the InGaAs and Ge photodiodes are optically biased, the entire detector response is that of the InGaP photodiode only, with zero response above 650 nm. The InGaAs photodiode shows a response from 650 nm to 900 nm, while the Ge photodiode responds at greater than 900 nm. The crosstalk between the InGaP and InGaAs photodiodes and between the InGaAs and Ge photodiodes is a result of i) luminescence coupling,[11,12] ii) photon flux leakage through the InGaP and InGaAs photodiodes, as they may not be optically thick, and iii) shunts in one or more of the photodiodes.[9,10] In both cases, the crosstalk responsivity is less than ten percent of the responsivity in the photodiode's intended response range.

Figure 11:
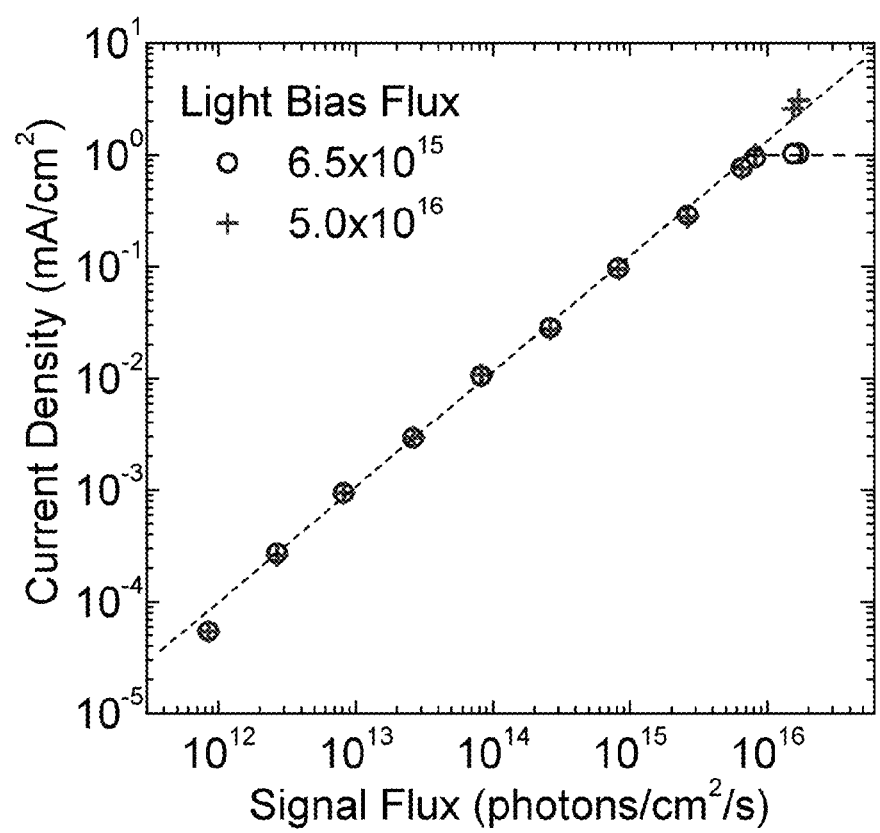
FIG. 11 shows the linear dynamic range of the InGaP photodiode with matching light bias photon flux on the InGaAs and Ge photodiodes of Example 2; the detector output current saturates after the photogenerated current due to the signal photon flux is larger than the photogenerated current from the light bias photon flux (dashed lines are guides for the eye).

The linear dynamic range of the InGaP photodiode covers four orders of magnitude, as shown in FIG. 11, under two light bias conditions. The detector current increases linearly as the input signal increases until the photogenerated current due to the signal is larger than the photogenerated current from the light bias. After this point, the detector output saturates due to one of the non-active photodiodes limiting the current. The intensity of the biasing LEDs can limit the upper end of the dynamic range before the detector itself begins to saturate. This is the case in FIG. 11, as increasing the light bias by an order of magnitude allows the detector current to continue to increase. The lower detection limit is determined mainly by the noise of the active photodiode.

In summary, a novel optically-addressed two-terminal multi-color detector has been proposed, and a two-terminal three-color detector has been experimentally demonstrated. The measured dark J-V, responsivity, and linear dynamic range prove the viability of this optically-addressed two-terminal photodetector concept. Using only two-terminals and incorporating optical biasing allows a FPA with pixels consisting of a large number of monolithic photodiodes to detect, in principle, an almost unlimited number of colors using existing single-color ROICs. Simplified FPA processing and ROIC architectures, along with the increased FPA fill factor, are major advantages of this multi-color detector.

REFERENCES

[1] W. H. Rolls, A two-color infrared detector, Electro-Optical Systems Design 9, 10 (1977).
[2] J. C. Campbell, T. P. Lee, A. G. Dentai, C. A. Burrus, Appl. Phys. Lett. 34, 401 (1979).
[3] M. J. Sun, W. S. C. Chang, C. M. Wolfe, Appl. Opt. 17, 3533 (1978).
[4] E. F. Schulte, U.S. Pat. No. 5,113,076, (1992).

[5] E. R. Blazejewski, J. M. Arias, G. M. Williams, W. McLevige, M. Zandian, J. Pasko, Workshop on the Physics and Chemistry of Mercury Cadmium Telluride and Other II-VI Compounds, 1626 (1992).
[6] A. Rogalski, Opto-Electronics Review 16, 458 (2008).
[7] K. Kosai, U.S. Pat. No. 5,731,621, (1998).
[8] T. Chu, U.S. Pat. No. 5,059,786, (1991).
[9] M. Meusel, C. Baur, G. Letay, A. W. Bett, W. Warta, E. Fernandez, Prog. Photovolt:Res. Appl. 11, 499 (2003).
[10] S. H. Lim, K. O'Brien, E. H. Steenbergen, J.-J. Li, Y.-H. Zhang, IEEE 35$^{th}$ PVSC (2010), in press.
[11] C. Baur, M. Hermle, F. Dimroth, A. W. Bett, Appl. Phys. Lett. 90, 192109 (2007).
[12] H. Yoon, R. R. King, G. S. Kinsey, S. Kurtz, D. D. Krut, IEEE 3$^{rd}$ World Conf. on PV Energy Cony., 745 (2003).

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to claims associated with these embodiments, along with the full scope of equivalents to which such claims are entitled.

We claim:

1. A photodetector module comprising,
   (i) one or an array of multi junction photodetectors (MJPDs), wherein each individual MJPD comprises
      (a) a first building block having a first bandgap;
      (b) an ultimate building block, having a second bandgap, positioned over or under the first building block; and
      (c) a tunnel diode between each of the building blocks; wherein the tunnel diodes have reversed polarity with respect to the building blocks; and
      wherein the building blocks are serially connected with the same polarization, and the first and second bandgaps are not identical; and
      wherein the first building block or ultimate building block comprises a detecting surface;
   (ii) a first light source having a first light spectrum that can be absorbed only by the first building block; and
   (iii) a second light source having a second light spectrum that can be absorbed only by the ultimate building block; wherein each light source is positioned to illuminate the detecting surface of the MJPDs.

2. The photodetector module of claim 1, comprising an array of MJPDs arranged in a predetermined arrangement.

3. The photodetector module of claim 2, wherein the array is a two-dimensional array.

4. The photodetector module of claim 2, wherein the array is a linear array.

5. The photodetector module of claim 2, wherein each individual MJPD comprises two contacts; wherein one contact is a discrete contact for each individual MJPD and the second contact is a common contact for the entire array.

6. The photodetector module of claim 1, wherein each individual MJPD further comprises a semiconducting substrate, wherein the first or ultimate building block is positioned over the semiconducting substrate.

7. The photodetector module of claim 6, wherein the semiconducting substrate is an III-V or II-VI semiconductor substrate.

8. The photodetector module of claim 7, wherein the semiconducting substrate comprises GaAs, GaSb, InAs, InSb, or InP.

9. The photodetector module of claim 6, wherein the semiconducting substrate is a virtual substrate comprising an epitaxial III-V or II-VI semiconductor layer grown on a semiconducting substrate, where the semiconducting substrate comprises a different material than the epitaxial III-V or II-VI semiconductor layer.

10. The photodetector module of claim 9, wherein the virtual substrate comprises either (i) a GaAs, InP, GaSb, ZnTe, or ZnCdTe epitaxial layer grown on a Si or Ge substrate; or (ii) a InP, GaSb, ZnTe, or ZnCdTe epitaxial layer grown on a GaAs substrate.

11. The photodetector module of claim 6, wherein each building block is lattice matched or pseudomorphically strained, or mismatched, to the semiconducting substrate.

12. The photodetector module of claim 1, comprising an array of MJPDs, wherein the array is bump mounted to a readout integrated circuit, and wherein the first MJPD or ultimate MJPD is in contact with the bumps.

13. The photodetector module of claim 1, further comprising
   (i) a third building block having a third bandgap positioned between the first and ultimate building blocks, wherein the building blocks are serially connected with the same polarization, and the first, second, and third bandgaps are not identical; and
   (ii) a third light source having a third light spectrum that can be absorbed only by the third building block; wherein the third light source is positioned to illuminate the detecting surface of the MJPDs.

14. The photodetector module of claim 13, further comprising
   (i) a fourth building block having a fourth bandgap positioned between the first and ultimate building blocks, wherein the building blocks are serially connected with the same polarization, and the first, second, third, and fourth bandgaps are not identical; and
   (ii) a fourth light source having a fourth light spectrum that can be absorbed only by the fourth building block; wherein the fourth light source is positioned to illuminate the detecting surface of the MJPDs.

15. The photodetector module of claim 14, further comprising
   (i) a fifth building block having a fifth bandgap positioned between the first and ultimate building blocks, wherein the building blocks are serially connected with the same polarization, and the first, second, third, fourth, and fifth bandgaps are not identical; and
   (ii) a fifth light source having a fifth light spectrum that can be absorbed only by the fifth building block; wherein the fifth light source is positioned to illuminate the detecting surface of the MJPDs.

16. The photodetector module of claim 15, further comprising
   (i) a sixth building block having a sixth bandgap positioned between the first and ultimate building blocks, wherein the building blocks are serially connected with the same polarization, and the first, second, third, fourth, fifth, and sixth bandgaps are not identical; and (ii) a sixth light source having a sixth light spectrum that can be absorbed only by the sixth building block; wherein the sixth light source is positioned to illuminate the detecting surface of the MJPDs.

17. The photodetector module of claim 1, wherein each of the light sources is a light emitting diode, a laser diode, or a broadband light source with a set of filters.

18. The photodetector module of claim 1, further comprising a shutter positioned to isolate the MJPDs from the light signal.

19. The photodetector module of claim 1, further comprising an optical modulator positioned to modulate the light signal.

20. The photodetector module of claim 1, wherein each building block independently comprises semiconducting alloy layers.

21. The photodetector module of claim 1, wherein each building block independently comprises III-V, II-VI, IV-IV, or IV-VI alloy layers.

22. The photodetector module of claim 21 wherein each building block comprises a p-n junction having at least two alloy layers, wherein the alloy layers are independently III-V, II-VI, IV-IV, or IV-VI alloy layers, wherein one alloy layer is p-doped and the other alloy layer is n-doped.

23. The photodetector module of claim 22, wherein each III-V alloy layer independently comprises GaSb, InAsSb, GaInSb, GaInAsSb, or AlGaAsSb.

24. The photodetector module of claim 22 wherein each II-VI alloy layer independently comprise a binary, ternary, or quaternary (MgZnCdHg)(SeTe) alloy.

25. The photodetector module of claim 24, wherein each II-VI alloy layer independently comprises ZnTe, CdZnTe, CdSeTe, MgSeTe, ZnCdSeTe, HgCdTe, HgCdSe, or CdHgSeTe.

26. The photodetector module of claim 1, wherein the bandgap of each of the building blocks is between about 0.012 and about 6.2 eV.

27. A method for collecting an optical signal comprising providing an photodetector module comprising one or an array of multi junction photodetectors (MJPDs), wherein each individual MJPD comprises
(a) a first building block having a first bandgap;
(b) an ultimate building block, having a second bandgap, positioned over or under the first building block; and
(c) a tunnel diode between each of the building blocks;
wherein the tunnel diodes have reversed polarity with respect to the building blocks;
wherein the building blocks are serially connected with the same polarization, and the first and second bandgaps are not identical; and
wherein the first building block or ultimate building block comprises a detecting surface;
illuminating the detecting surface with one or more light sources to optically bias all except for one of the building blocks within each of the individual MJPDs;
exposing the detecting surface to an optical signal to generate a photodetector response; and
collecting the photodetector response.

28. The method of claim 27, wherein the detecting surface is illuminated with one light source for each building block that is optically biased.

29. The method of claim 27, comprising controlling the one or more light sources to change which one of the building blocks is not optically biased.

30. The method of claim 27, wherein the photodetector response is an electrical current.

31. The method of claim 27, wherein the photodetector response is a voltage.

32. The method of claim 27, wherein the illuminating is simultaneously illuminating the detecting surface with one or more light sources to optically bias all except for one of the building blocks within each of the individual MJPDs.

33. The method of claim 27, wherein the exposing comprises modulating the optical signal.

34. A method for collecting an optical signal comprising providing an photodetector module according claim 1;
illuminating the detecting surface with the light sources to optically bias all except for one of the building blocks within each of the individual MJPDs;
exposing the detecting surface to an optical signal to generate an photodetector response; and
collecting the photodetector response.

* * * * *